US011372063B2

United States Patent
Mandal et al.

(10) Patent No.: US 11,372,063 B2
(45) Date of Patent: Jun. 28, 2022

(54) MULTI-CHANNEL MAGNETIC RESONANCE SPECTROMETER MODULES AND SYSTEMS

(71) Applicant: CASE WESTERN RESERVE UNIVERSITY, Cleveland, OH (US)

(72) Inventors: Soumyajit Mandal, Shaker Heights, OH (US); David Ariando, Cleveland, OH (US); Mason Greer, Cleveland Heights, OH (US); Cheng Chen, Cleveland, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 8 days.

(21) Appl. No.: 17/125,563

(22) Filed: Dec. 17, 2020

(65) Prior Publication Data

US 2021/0181276 A1 Jun. 17, 2021

Related U.S. Application Data

(60) Provisional application No. 62/949,213, filed on Dec. 17, 2019.

(51) Int. Cl.
*G01R 33/34* (2006.01)
*G01R 33/36* (2006.01)
(Continued)

(52) U.S. Cl.
CPC ... *G01R 33/34092* (2013.01); *G01R 33/3607* (2013.01); *G01R 33/3621* (2013.01);
(Continued)

(58) Field of Classification Search
CPC .......... G01R 33/34092; G01R 33/3607; G01R 33/3621; G01R 33/3635; G01R 33/543; G01R 33/5608
See application file for complete search history.

(56) References Cited

U.S. PATENT DOCUMENTS

| 7,106,064 B2 | 9/2006 | Yoshizawa | |
|---|---|---|---|
| 2014/0139216 A1* | 5/2014 | Rapoport | G01R 33/3852 324/312 |

(Continued)

FOREIGN PATENT DOCUMENTS

| CN | 1195267 C | 3/2005 |
|---|---|---|
| CN | 101345534 B | 6/2012 |
| CN | 203164402 U | 8/2013 |

OTHER PUBLICATIONS

David Ariando, et al.; "An autonomous, highly portable NMR spectrometer based on a low-cost System-on-Chip (SOC)"; Journal of Magnetic Resonance 299 (2019); journal homepage: www.elsevier.com/locate/jmr; Dec. 15, 2018; 19 pgs.

(Continued)

*Primary Examiner* — Gregory H Curran
(74) *Attorney, Agent, or Firm* — Tarolli, Sundheim, Covell & Tummino LLP

(57) ABSTRACT

An example multi-channel magnetic resonance (MR) system is described. The system includes a plurality of radio frequency (RF) coils and a plurality of spectrometer transceiver channels. Each of the channels including a spectrometer coupled a respective set of the RF coils. The spectrometer is configured to transmit RF signals to excite respective RF coils and to receive MR sensor signals from the excited respective RF coils responsive to excitation thereof. The spectrometer is configured to perform MR spectrometry to provide MR measurement data based on the received MR sensor signals for the respective channel. A synchronization module is coupled to the spectrometer of the respective channel. The synchronization module is configured to synchronize the spectrometer of the respective channel with spectrometers in other channels via a communication link.

20 Claims, 9 Drawing Sheets

(51) Int. Cl.
  G01R 33/54    (2006.01)
  G01R 33/56    (2006.01)
(52) U.S. Cl.
  CPC ....... *G01R 33/3635* (2013.01); *G01R 33/543* (2013.01); *G01R 33/5608* (2013.01)

(56) References Cited

U.S. PATENT DOCUMENTS

2016/0274204 A1*  9/2016  Song ................ G01R 33/3621
2017/0371018 A1  12/2017  Siddiqui et al.
2018/0238945 A1*  8/2018  Buck ................. G01R 27/2611

OTHER PUBLICATIONS

Pruessmann, K.P., et al.; "SENSE: Sensitivity encoding for fast MRI"; Magnetic Resonance in Medicine, 42: 952-962; Oct. 28, 1999; 11 pgs.; https://doi.org/10.1002/(SICI)1522-2594(199911)42:5<952::AID-MRM16>3.0.CO;2-S.

Dongwan Ha, et al.; "Scalable NMR spectroscopy with semiconductor chips"; Article—Proceedings of the National Academy of Sciences—111 (33) 11955-11960; Aug. 19, 2014; 6 pgs.; DOI: 10.1073/pnas.1402015111.

Ulrich Katscher, et al.; "Parallel RF transmission in MRI"; NMR in Biomedicine; NMR Biomed. vol. 19 Issue 3, Published onlinne in Wiley InterScience (www.interscience.wiley.com); May 16, 2006; 8 pgs.; DOI:10.1002/nbm.1049.

S. Mandal, et al.; "An ultra-broadband low-frequency magnetic resonance system"; Journal of Magnetic Resonance vol. 242; journal homepage: www.elsevier.com/locate/jmr; Mar. 4, 2014; pp. 113-125.

Jay R. Porter, et al.; "A sixteen-channel multiplexing upgrade for single channel receivers"; Magnetic Resonance Imaging vol. 19; Elsevier; Jun. 17, 2001; 8 pgs.

Ishaan L. Dalal, et al.; "A Low-Cost Scalable Multichannel Digital Receiver for Magnetic Resonance Imaging"; Proceedings of the 28th IEEE EMBS Annual International Conference New York City; Aug. 30-Sep. 3, 2006; 4 pgs.

Hsueh-Ying Chen, et al.; "An ultra-low cost NMR device with arbitrary pulse programming"; Journal of Magnetic Resonance vol. 255; journal homepage: www.elsevier.com/locate/jmr; Mar. 10, 2015; 6 pgs.

Jerzy Bodurka, et al.; "Scalable Multichannel MRI Data Acquisition System"; Magnetic Resonance in Medicine vol. 51 Issue 1; Jan. 2004; 7 pgs.; https://doi.org/10.1002/mrm.10693.

Michael Twieg, et al.; "High Efficiency Radiofrequency Power Amplifier Module for Parallel Transmit Arrays at 3 Tesla"; Magnetic Resonance in Medicine vol. 78 Issue 4; Oct. 2017; 10 pgs.; https://doi.org/10.1002/mrm.26510.

Soumyajit Mandal, et al.; "Absolute phase effects on CPMG-type pulse sequences"; Journal of Magnetic Resonance vol. 261; journal homepage: www.elsevier.com/locate/jmr; Oct. 31, 2015; 12 pgs.

Carl A. Michal, et al.; "A high performance digital receiver for home-built nuclear magnetic resonance spectrometers"; Review of Scientific Instruments 73, 453 (2002); https://doi.org/10.1063/1.1433950 Submitted: Sep. 10, 2001 . Accepted: Nov. 15, 2001 . Published Online: Feb. 19, 2002; 7 pgs.

S.B. Belmonte, et al.; Design Note "A field-programmable gate-array-based high-resolution pulse programmer"; Measurement Science and Technology vol. 14 No. 1; Dec. 11, 2002; 5 pgs.

Cheng Chen, et al.; "Real-Time Data Inversion Methods for Low-Field Nuclear Magnetic Resonance (NMR)"; 2018 IEEE 23rd International Conference on Digital Signal Processing (DSP), Location of Conference: Shanghai, China, Date of Conference: Nov. 19-21, 2018; Date Added to IEEE Xplore: Feb. 4, 2019; 5pgs; doi: 10.1109/ICDSP.2018.8631631.

Ishaan L. Dalal, et al.; "A Reconfigurable FPGA-based 16-Channel Front-End for MRI"; Fortieth Asilomar Conference on Signals, Systems and Computers, Location of Conference: Pacific Grove, CA, USA, Date of Conference: Oct. 29-Nov. 1, 2006; Date Added to IEEE Xplore: May 7, 2007; 5 pgs.; doi: 10.1109/ACSSC.2006.355084.

Y.-Q. Song, et al.; "Real-time optimization of nuclear magnetic resonance experiments"; Journal of Magnetic Resonance vol. 289; journal homepage: www.elsevier.com/locate/jmr; Feb. 13, 2018; 7 pgs.

Xiao Liang, et al.; "A digital magnetic resonance imaging spectrometer using digital signal processor and field programmable gate array"; Cite as: Rev. Sci. Instrum. 84, 054702 (2013); https://doi.org/10.1063/1.4803007 Submitted: Feb. 8, 2013 . Accepted: Apr. 11, 2013 . Published Online: May 2, 2013; 9 pgs.

Mason Greer; "Portable and Autonomous Magnetic Resonance"; (Electronic Thesis or Dissertation); Case Western Reserve University; Retrieved from https://etd.ohiolink.edu/; 2020; 243 pgs.

Shen Jie, et al.; "Home-built magnetic resonance imaging system (0.3 T) with a complete digital spectrometer"; Cite as: Rev. Sci. Instrum. 76, 105101 (2005); https://doi.org/10.1063/1.2069707; Submitted: Feb. 17, 2005 . Accepted Aug. 22, 2005 . Published Online: Oct. 6, 2005; 9 pgs.

Kazuyuki Takeda; "A highly integrated FPGA-based nuclear magnetic resonance spectrometer"; Cite as: Rev. Sci. Instrum. 78, 033103 (2007); https://doi.org/10.1063/1.2712940; Submitted: Dec. 12, 2006 . Accepted: Feb. 7, 2007 . Published Online: Mar. 14, 2007; 7 pgs.

Li Gengying, et al.; "Digital nuclear magnetic resonance spectrometer"; Cite as: Review of Scientific Instruments 72, 4460 (2001); https://doi.org/10.1063/1.1386629; Submitted: Nov. 14, 2000 . Accepted: May 26, 2001 . Published Online: Nov. 27, 2001; 5 pgs.

Weng Kung Peng, et al.; "Development of miniaturized, portable magnetic resonance relaxometry system for point-of-care medical diagnosis"; Cite as: Rev. Sci. Instrum. 83, 095115 (2012); https://doi.org/10.1063/1.4754296 Submitted: Apr. 9, 2012 . Accepted: Sep. 5, 2012 . Published Online: Sep. 26, 2012; 9 pgs.

Tianshi Chen, et a.; "DianNao: A Small-Footprint High-Throughput Accelerator for Ubiquitous Machine-Learning"; ACM SIGARCH Computer Architecture News; vol. 42, Issue 1; ASPLOS '14; Mar. 2014; 15 pgs.; DOI: 10.1145/2654822.

Shinya Handa, et al.; "Single-chip pulse programmer for magnetic resonance imaging using a microcontroller"; Cite as: Rev. Sci. Instrum. 78, 084705 (2007); https://doi.org/10.1063/1.2773636; Submitted: May 15, 2007 . Accepted: Jul. 30, 2007 . Published Online: Aug. 23, 2007; 5 pgs.

Pedro Moreira, et al.; "Digital Dual Mixer Time Difference for Sub-Nanosecond Time Synchronization in Ethernet"; IEEE International Frequency Control Symposium, Location of Conference: Newport Beach, CA, USA; Date of Conference: Jun. 1-4, 2010; Date Added to IEEE Xplore: Aug. 23, 2010; 5 pgs.; doi: 10.1109/FREQ.2010.5556289.

Carl A. Michal; "A low-cost spectrometer for NMR measurements in the Earth's magnetic field"; IOP Publishing, Measurement Science and Technology; vol. 21, No. 10; Aug. 9, 2010; 10 pgs.; doi:10.1088/0957-0233/21/10/105902.

Maciej Lipinski, et al.; "White Rabbit: a PTP Application for Robust Sub-nanosecond Synchronization"; IEEE International Symposium on Precision Clock Synchronization for Measurement, Control and Communication, Conference Location: Munich, Germany, Date of Conference: Sep. 12-16, 2011; Date Added to IEEE Xplore: Nov. 7, 2011; 6 pgs.; doi: 10.1109/ISPCS.2011.6070148.

Xiaojin Zhu, et al.; "Introduction to Semi-Supervised Learning Synthesis Lectures on Artificial Intelligence and Machine Learning"; Morgan & Claypool Publishers; 2009; 130 pgs.; https://doi.org/10.2200/S00196ED1V01Y200906AIM006.

D. Pedretti; "Nanoseconds Timing System Based on IEEE 1588 FPGA Implementation"; IEEE Transactions on Nuclear Science, vol. 66, No. 7, Jul. 2019; 8 pgs.; doi: 10.1109/TNS.2019.2906045.

* cited by examiner

MULTI-CHANNEL MAGNETIC RESONANCE SPECTROMETER MODULES AND SYSTEMS

RELATED APPLICATION

This application claims the benefit of priority to U.S. Provisional Patent Application Ser. No. 62/949,213, filed Dec. 17, 2019, and entitled MULTI-CHANNEL MRI SYSTEM AND METHOD, which is incorporated herein by reference in its entirety.

GOVERNMENT FUNDING

This invention was made with government support under Grant No. 1563688, awarded by the National Science Foundation (NSF). The United States government has certain rights in the invention.

TECHNICAL FIELD

This disclosure relates to multi-channel magnetic resonance systems and related methods.

BACKGROUND

Magnetic Resonance Imaging (MRI) is a non-invasive imaging technology used to investigate anatomy and function of the body in both health and disease without the use of damaging ionizing radiation. While the MRI market is a fast-growing segment of the medical imaging industry, the high costs and generally large size tend to make their availability limited for various applications and for experiments.

SUMMARY

As an example, a multi-channel magnetic resonance (MR) system is includes a plurality of radio frequency (RF) coils and a plurality of spectrometer transceiver channels. Each of the channels including a spectrometer coupled a respective set of the RF coils. The spectrometer is configured to transmit RF signals to excite respective RF coils and to receive MR sensor signals from the excited respective RF coils responsive to excitation thereof. The spectrometer is configured to perform MR spectrometry to provide MR measurement data based on the received MR sensor signals for the respective channel. A synchronization module is coupled to the spectrometer of the respective channel. The synchronization module is configured to synchronize the spectrometer of the respective channel with spectrometers in other channels via a communication link.

Another example relates to a multi-channel magnetic resonance (MR) spectrometer module. The module includes a system on chip (SoC), the SoC comprising a field programmable gate array (FPGA) and a processor core. The processor core is coupled to the FPGA through a bus on the SoC. The SoC has a synchronization input to receive a synchronization signal, based on which the SoC controls timing an operation of the spectrometer module. Analog front-end (AFE) circuitry is coupled to the FPGA. The AFE circuitry includes transmitter channels and receiver channels. Each transmitter channel is configured to transmit and respective radio frequency (RF) signals to respective outputs adapted to be coupled to respective transmitter RF coils. Each receiver channel is configured to receive respective MR sensor signals at respective inputs adapted to be coupled to respective receiver RF coils. The SoC is configured to control the AFE circuitry and to process data representing the received MR sensor signals.

DETAILED DESCRIPTION

This disclosure relates to multi-channel magnetic resonance imaging systems and related methods.

For example, the multi-channel MRI system may be implemented as a low-cost system-on-chip (SoC) that integrates a field programmable gate array (FPGA) with one or more hard processors. The system further may be designed to be programmable using standard scripts and also provide a graphical user interface (e.g., in the commonly-used Qt and/or MATLAB environments). The system may include outputs to drive imaging gradient amplifiers and, in addition, a number of configurable transmit and receive channels. Each channel of the system may include a multiplexer, a spectrometer, and a synchronization module. The system may also utilize a scalable method for providing the user with a number of transmit and receive channels for parallel imaging. For example, spectrometer modules may be added (or removed) from the system to accommodate any number of probes. The system thus enables a user to program tens or hundreds of outputs for driving arrays of i) RF coils, ii) magnetic gradient coils that are needed for imaging, and iii) other imaging systems (such as ultrasound) to implement multi-modal imaging methods. The system may also implement machine learning to configure the system autonomously. The machine learning may be implemented on the SoC (e.g., as instructions executed by a processor core) and/or remotely through a network communication link.

For example, a multi-channel MRI console disclosed herein may increase training possibilities for electrical and computer engineers who want to work in the medical imaging and image-guided therapy industries. Such a system can greatly reduce the cost of MRI consoles and also make such systems more accessible to researchers. Thus, the systems and methods disclosed herein may be of interest to bioengineering departments in the USA and worldwide, as well as to a variety of industries and researchers engaged in building and/or designing novel MRI systems. For example, the low cost of the system will allow educational institutions from high school to the post-doc levels to use and build nuclear magnetic resonance (NMR) and MRI systems at costs that are similar to 3D printers. It further may be adapted to provide portable MRI systems and consoles to be provided at the point of care.

Figure 1:
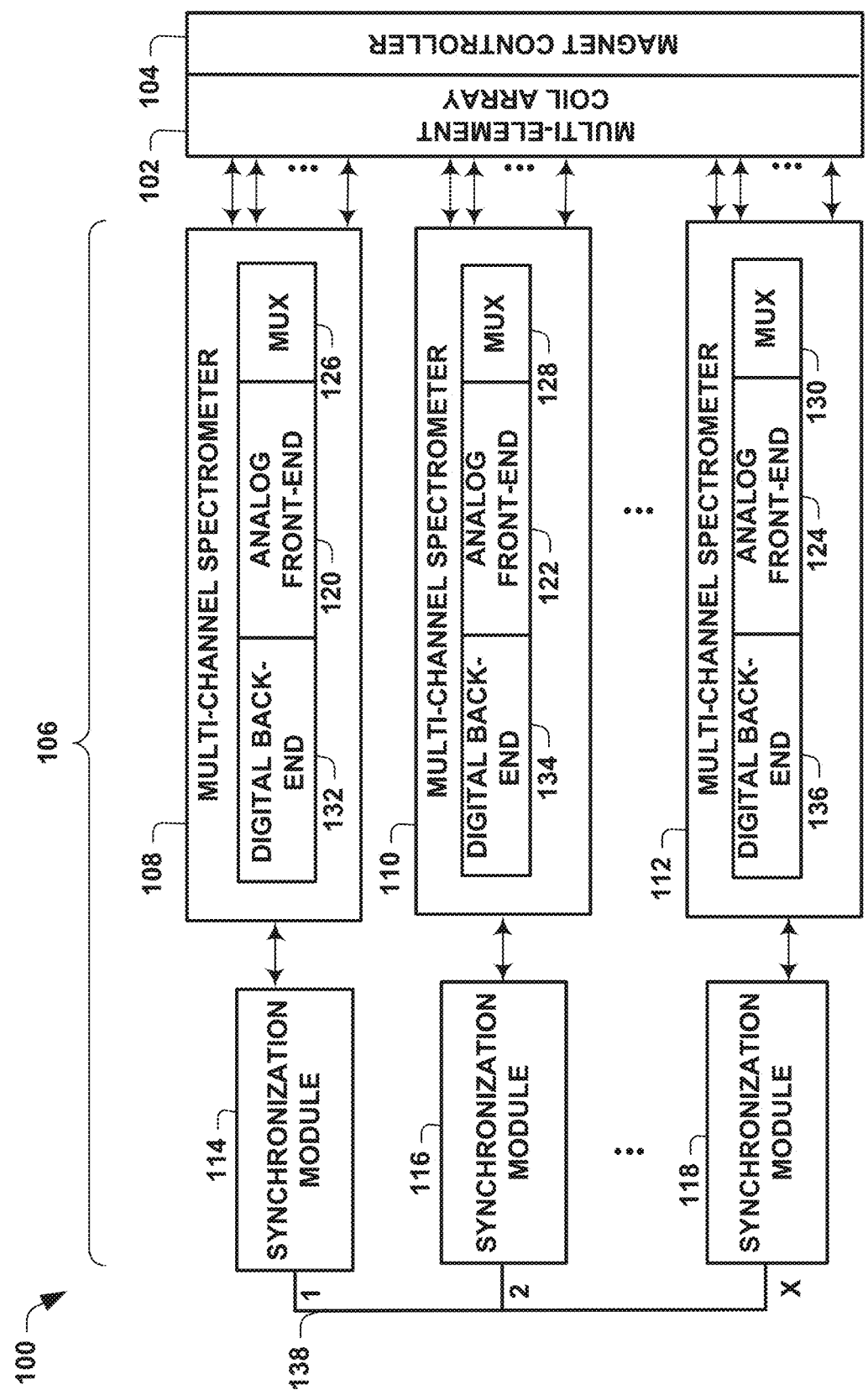
FIG. 1 depicts a block diagram of a multi-channel magnetic resonance (MR) imaging system.

FIG. 1 is a block diagram depicting an example multi-channel magnetic resonance imaging (MRI) system 100. The system 100 includes a multi-element coil array 102 that includes a plurality of radio frequency (RF) coils. In some examples, the system 100 includes magnet controllers 104 coupled to the some or all the respective coils in the array 102. The magnet controllers 104 are configured to tune the B-field configuration of the respective coils in the array 102.

The system 100 also includes a plurality of transceiver channels 106. In the example of FIG. 1, three transceiver channels 106 are shown. However, there can be any number X of transceiver channels 106, where X is a positive integer denoting the number of channels. As shown in FIG. 1, each of the channels 106 includes a spectrometer 108, 110 and 112 and a synchronization module 114, 116 and 118. The spectrometer 108, 110, 112 includes an analog front end (AFE) 120, 122, 124 that includes a multichannel receiver and transmitter. There may be N receive channels and M transmit channels, where N and M may specify the same or different numbers of receive and transmit channels.

Each spectrometer 108, 110, 112 also includes a respective multiplexer 126, 128, 130. The multiplexer 126, 128, 130 is coupled to transmit RF signals to excite each RF coil in a respective set of the RF coils, and also to receive MR signals induced within each RF coil in the same or another set of coils in response to the excitation signals. For example, the multiplexer 126, 128, 130 is configured to perform time-division multiplexing of the RF signals being transmitted from a given transmitter to each of the RF coils for a respective channel. By multiplexing each transmitter and receiver channel, only a single physical transmitter/receiver is needed for multi-channel excitation and data acquisition. The respective set of the RF coils for each channel may include M*N individual RF coils by default, in which the multiplexer 126, 128, 130 is configured to enable more coils to be covered depending on the multiplex factor of Y. The multiplex factor may be different for receiver and transmitter channels.

The spectrometer 108, 110, 112 for each channel also includes a respective digital back-end 132, 134, 136. As described herein, the digital back-end 132, 134, 136 for each of the channels 106 may be implemented as an SoC architecture. In an example, the SoC architecture for each channel includes an FPGA fabric that is coupled to the respective AFE 120, 122, 124. Each SoC can also include an FPGA, which includes MR pulse program, a driver, a buffer, a hardware tuner, and one or more processor cores to control the respective spectrometer 108, 110, 112. The spectrometer 108, 110, 112 thus is configured to perform MR spectrometry and/or imaging to provide MR data in response to the received MR signals for the respective channel, such as disclosed herein.

The synchronization modules 114, 116 and 118 are configured to synchronize the spectrometer for the respective channel with spectrometers in other channels via a network communication link 138 (e.g., implemented using communication protocol through physical layer, such as Ethernet, USB, Wi-Fi, Bluetooth, ZigBee or the like). For example, each synchronization module 114, 116 and 118 is configured to implement a precision time protocol (PTP) over the network link 138, such as according to the IEEE-1588 protocol. The synchronization modules 114, 116 and 118 implement the PTP and thus are configured to synchronize real-time clocks across the nodes of distributed systems. In an example, the synchronization modules 114, 116 and 118 implementing IEEE-1588 use a master/slave-architecture to achieve sub-µs timing errors within local sub-networks. The synchronization modules 114, 116 and 118 may implement other or a combination of timing protocols to synchronize operation of the spectrometers 108, 110, 112 (e.g., simple network time protocol (SNTP), GPS network time synchronization, etc.).

As shown in the example of FIG. 1, the MR system 100 combines hardware duplication (e.g., multiple SoC-based spectrometers synchronized via a high-bandwidth local network) and RF multiplexing to realize a scalable and low-cost solution. Inevitable timing errors between the channels have the potential to affect image quality for various parallel imaging methods (e.g., SENSE, GRAPPA, TRASE, etc.). To minimize these effects, the synchronization modules 114, 116 and 118 can be configured (e.g., include PTP hardware) to implement an IEEE-1588-based precision time protocol (PTP) for synchronization between the multiple SoC-based spectrometers, as may be needed required for a plurality of transmit and receive channels. The PTP timing data to synchronize operation of multiple spectrometer modules 108, 110 and 112 may be implemented over a wireless network link 138. In other examples, the synchronization modules 114, 116 and 118 may include respective transceivers coupled together through or a physical connection (e.g., electrically conductive or optical fiber connection) 138 that is used to implement a global clock and synchronization among the spectrometer modules 108, 110 and 112.

As an example, during synchronized operation, one of the spectrometer modules 108, 110 and 112 may be configured as a master module while the other modules operate as slaves. The master spectrometer module (e.g., module 108) is configured to send a bitstream synchronization signal over the link 138, such as may be implemented as an enable/disable (e.g., binary signal) addressed to each of the other spectrometer modules 110-112. In a further example, the bitstream synchronization signal may differentiate between enabling and disabling respective transmitter and receiver channels of the respective spectrometer modules 108-112.

By way of example, the AFE 120, 122, 124 provides a perturbing signal (excitation) (e.g., a pulse sequence) that consists of one or more RF pulses with frequency, amplitude and relative phase that are generated by a corresponding transmitter circuit of the respective module. As described herein, the pulse sequence may be programmed by a pulse programmer implemented by a processor core of the SoC in respective digital back-end 132, 134, 136. For example, the pulses are applied to the sample (or object under test) by a transmitter coil that generates an oscillating magnetic field responsive to the pulse sequence. A receiver coil converts this time-varying magnetization into an oscillating voltage through Faraday induction. In an example, the coil array 102 uses different coils for transmitting and receiving magnetic fields. In other examples, the same physical coil is used for both transmission and reception. The voltage detected by the receiver is amplified and digitized by a low-noise RF receiver circuit and the acquired MR signal is further processed, such as described herein.

Figure 2:
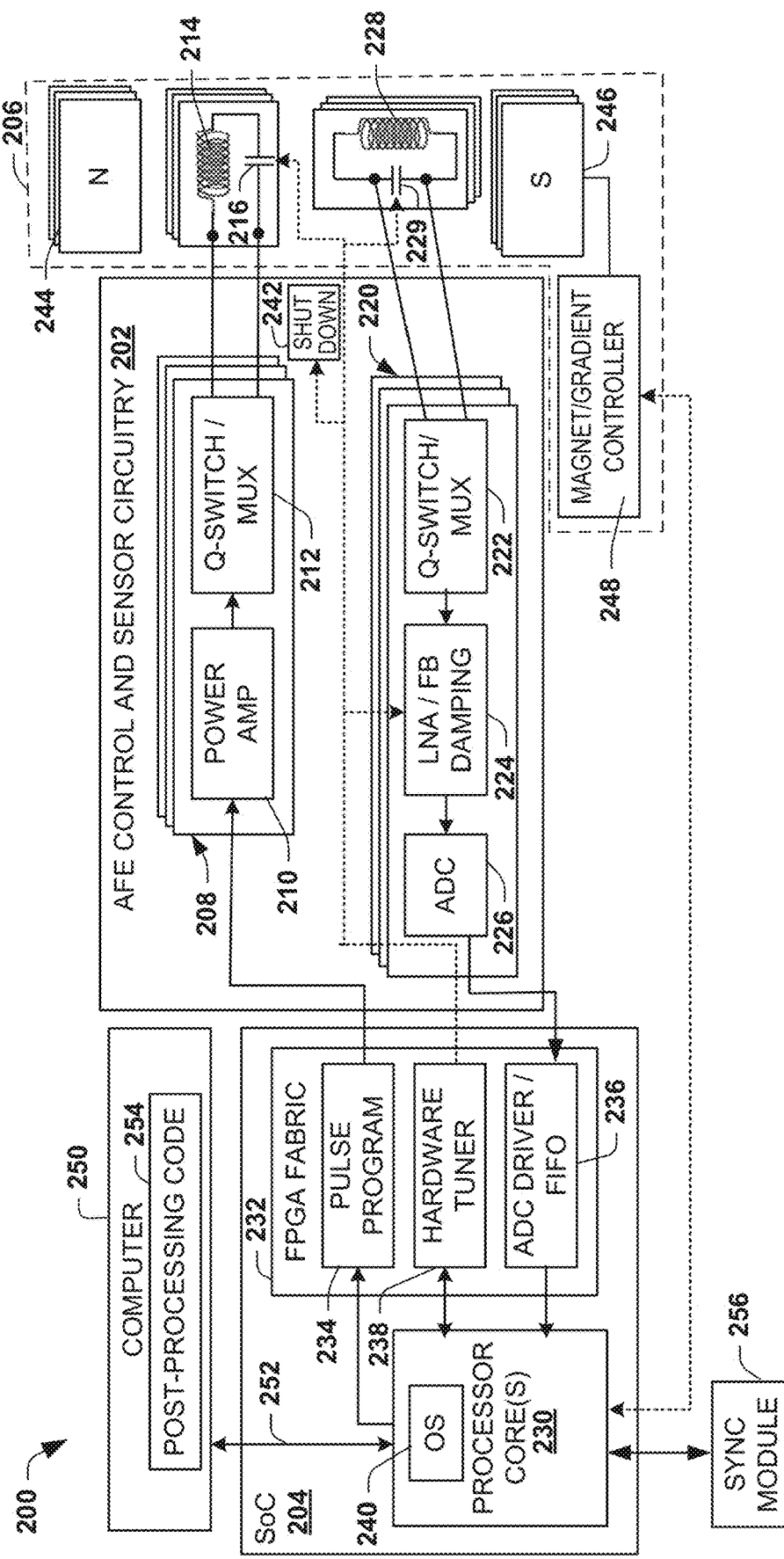
FIG. 2 depicts a block diagram of an example of a single channel spectrometer in the system of FIG. 1.

FIG. 2 is a high-level block diagram of an example MR (e.g., NMR) spectrometer module 200. The spectrometer 200 is a useful example of the multi-channel spectrometer 108, 110, 112 that may be used in the MR system 100 shown in FIG. 1. The spectrometer 200 includes an analog front-end (AFE) control and sensor circuitry 202, an SoC 204 and a coil subsystem 206. The AFE control and sensor circuitry 202 is coupled between the SoC 204 and coil subsystem 206.

In an example, the spectrometer is implemented as a modular circuit, and each module may include a low-power SoC-FPGA and analog front-end, that can operate using a battery. For example, a power supply (e.g., including one or more voltage regulators) is coupled to one or more battery cells to supply electrical power to the SoC 204 and the AFE circuitry 202. Thus, amplifiers, drivers and other active circuitry may be coupled to respective voltage rails to receive electrical power.

The circuitry 202 includes multichannel transmitter channels 208, where each channel includes circuitry for propagating respective signals along a path. There can be any number of transmitter channels 208 according to the number of channels. For each channel, the respective transmitter channel 208 includes a power amplifier (PA) 210 and a Q-switch and multiplexer block 212. For example, the channel's Q-switch 212 may be coupled to a respective transmitter coil 214 of the coil subsystem 206 through a multiplexer (e.g., corresponding to multiplexer 126, 128, 130). The transmitter coil 214 is coupled in series with a tunable series capacitor 216 between outputs of the multiplexer 212 for the respective channel. Each coil 214 and capacitor 216 may be referred to as a sensor or probe. For example, the Q-switch circuit includes an arrangement of field effect transistor (FET) switches configured to dissipate residual energy in the respective coil, and also composite pulses that coherently cancel this energy. In an example, the Q-switch 212 is controlled based on control data provided in a bitstream sequence produced by the SoC 204. The power amplifier (PA) 210 is coupled to receive a bitstream sequence for configuring pulse parameters of the excitation signal provided through the Q-switch/multiplexer 212 to a respective transmitter coil in the coil subsystem 206. Each respective transmitter channel 208 may be configured similarly to that described above.

The AFE circuitry 202 also includes multichannel receiver channels 220, where each channel includes respective circuitry for propagating signals along a receiver path. There can be any number of receiver channels 220 according to the number of channels, which may be the same or different number as the number of transmitter channels. For each receiver channel, the respective receiver channel 220 includes a include Q-switch/multiplexer block 222, low-noise preamplifier (LNA) with active-Q damping circuit (LNA/FB damping) 224, and an analog-to-digital converter (ADC) 226. In an example, the multiplexer of block 222 includes inputs coupled across the receiver coil 228 and an output coupled to Q-switch (or other switch circuitry) 222. In the example of FIG. 2, the Q-switch 222 is controlled based on control data provided in a bitstream sequence provided by the SoC 204, which may be the same or different bitstream sequence provided to the transmitter Q-switch 212. The channel's Q-switch 222 includes a pair of inputs coupled to respective terminals of a receiver coil 228 of the coil subsystem 206. The receiver coil 228 is coupled in parallel with a tunable capacitor 229 for the respective channel. Each RF coil 228 and capacitor 229 may be referred to as a sensor or probe.

As an example, the ADC 226 may be a high-resolution, high-speed ADC configured to digitize the amplified receiver outputs. As an example, ADC 226 may be a 14-bit, 25 Msps parallel-output ADC (e.g., LTC1746, available from Analog Devices) that allows Nyquist sampling (i.e., no under-sampling) for $f_0$ values up to ~10 MHz. A high-speed ADC with parallel outputs may be preferable over one with serial outputs since the former can use a significantly lower clock rate than the latter. The lower clock rate can help simplify the ADC interface used in the spectrometer 200. The ADC clock can be digitally programmed using a reconfigurable phase-locked loop (PLL), thus allowing the sampling frequency to be easily programmed using software. For example, when an ADC with a parallel output bus is used, the FPGA 232 may include control logic that runs at the ADC sample to simplify the design (relative to a serial bus design) by relaxing its timing constraints.

The SoC 204 includes one or more processor cores 230 and an FPGA fabric 232. In the example of FIG. 2, the FPGA fabric 232 includes a pulse program module 234, an ADC driver and first-in first-out (FIFO) buffer (ADC driver/FIFO) 236 and a hardware tuner 238. The FPGA 232 may be configured to implement timing sensitive functions such as relating to hardware configuration and timing associated with multi-channel image acquisition. The pulse program module 234 is coupled to the respective power amplifiers 210 for each of the transmitter channels 208. The pulse program module 234 is configured to provide a control signals to the power amplifier 210 for generating one or more pulses having a frequency, amplitude and phase for exciting the respective transmitter coil 214. The pulse program module further can be coupled to driver circuitry for controlling (e.g., enabling and disabling) the respective Q-switches 212 and 222.

In an example, the power amplifier (PA) 210 is implemented as a class D power amplifier, such as based on Gallium Nitrite Field Effect Transistor (GaNFET) H-bridge topology. In an example, the amplifier 210 is configured to provide differential output up to about 350 W power delivered to the coil through the Q-switch/multiplexer 212. In other examples, the PA 210 is implemented as a class-A, E or F switching amplifier. In such examples, the input of the PA 210 is directly driven by the pulse program module 234, which may be configured to generate respective differential square-wave signals, such as described herein. For example, the power amplifier input receives a bitstream signal (produced by pulse program module 234) that is programmed to implement a transmitter signal having respective transmitter parameters (e.g., amplitude, frequency and phase). This may eliminate the need for a high-speed digital-to-analog converter (DAC). Harmonics of the square-wave are filtered using a multiple-feedback differential low-pass filter (LPF).

The ADC driver/FIFO module 236 is coupled to the ADC 226 of each of the receiver channels 220. The ADC driver/FIFO 236 is configured to drive the ADC and receive digital scan data received from the respective receiver coils, which data has been received and processed by receiver circuitry 222, 224 and converted to a corresponding digital representation of the received signal by ADC 226.

The hardware tuner 238 is coupled to the LNA/FB damping circuit 224 as well as to the tunable transmitter capacitors 216 and receiver capacitors 229 for each channel of the respective coil subsystem 206. The hardware tuner 238 is configured to set the capacitance of respective capacitors 216, 229 to implement impedance matching between the transmitter and receiver circuitry of the AFE and the coils 214, 228 for each channel. As an example, the HW tuner 238 is configured to set the capacitance of the variable capacitor (e.g., a capacitor network) 216 by configuring switches of a capacitor network based on an impedance value determined by the hardware tuner (or other code) implemented on the SoC. For example, the matching network 216 uses relays (or other switch devices) to switch in/out capacitors, thus allowing the tuning to be digitally-controlled from software (e.g., through a register of hardware tuner 238). In an example, a directional-coupler-based reflection measurement may be implemented in order to quantify impedance matching of the digitally-tunable matching network, effectively closing a feedback loop for automatic tuning of the matching network.

As an additional example, the hardware tuner 238 is configured to adjust damping of the LNA/FB damping circuit 224 to change the quality (Q) factor of the coil. For example, the hardware tuner 238 is configured to provide a digital value to a DAC that is coupled to a varactor circuit so as to adjust damping to decrease Q and thereby enable the coil to ring down faster and increase the bandwidth of the receiver. The hardware tuner thus can configure circuitry directly in a closed loop manner (e.g., without requiring additional software processing). In an example, the damping may also be configurable through machine learning implemented by the SoC 204, as described herein.

As an example, the one or more processor cores 230 may be implemented as an ARM processor core implementing an operating system (e.g., a Linux operating system) 240. Because the processor core may implement the OS, which may support high-level programming languages (e.g., C, Python etc.), the processor core may be programmed to implement a variety of libraries, signal processing functions as well as configure the bitstream for multi-channel operation. For example, the processor core 230 is coupled to the FPGA fabric 232 through a bus, such as an advanced extensible interface (AXI). The bus may be used for communicating instructions and data to various modules of the FPGA 232.

For example, the processor core 230 is configured to transfer data/instructions through the bus and directly in respective registers of the FPGA, including registers associated with each of the pulse program module 234, the ADC driver/FIFO 236 and the hardware tuner 238. In one example, the processor core 230 includes code programmed to determine a bitstream sequence for a transmitter channel, and provides the respective bitstream sequence through the bus to a register of the pulse program module 234. Additionally, the processor core 230 includes code programmed to determine a digital value for configuring a varactor (or other circuitry) that is stored in a respective register of the hardware tuner, which may be transferred to a DAC for configuring LNA/FB damping circuit 224. As mentioned above, each channel transmitter coil 214 and receiver coil 228 further includes a digitally-tunable impedance matching network, as shown by the tunable series capacitor 216 on the transmitter coil 214 and the parallel capacitor 229 on the receiver coil 228. The processor core 230 thus includes code programmed to determine a digital values for configuring a varactor (or other switch circuit circuitry) that may be stored in a respective register of the hardware tuner and used to configure respective capacitors 216 and 229.

The coil subsystem 206 also includes a configurable (e.g., semi-permanent) magnet 244, 246 for respective transmitter and receiver channels. The magnets 244, 246 may include permanent magnet and gradient magnet portions, in which the gradient portion is configurable by a magnet controller 248. For example, the magnet controller 248 includes circuitry configured to send electrical current to the gradient magnet portions to establish the aggregate magnetic field, which includes a static field (from the permanent magnet) and a gradient field (from the configurable magnet). As described herein, the magnet configuration thus is configurable, such as implemented as part of an adaptive algorithm (e.g., instructions executed by the processor core 230), which further may be implemented through machine learning.

The AFE circuitry 202 may also include a shutdown circuit 242, which may be configured to reduce power consumption. For example, the hardware tuner module 238 includes a register for programming whether to enable or disable the shutdown circuit 242. The shutdown circuit 242 may be coupled to various components of the AFE circuitry 202 (in each spectrometer module of the system 100), such as including amplifiers, power supplies and the like. The hardware tuner 238 (or code programmed on the processor core) may be configured to monitor the pulse program module 234 for an active bitstream sequence (e.g., stored in a respective register thereof). In the absence of detecting a bitstream sequence for a transmitter/receiver channel or otherwise detecting an idle state for a respective spectrometer module 200, a register of the hardware tuner 238 linked to the shutdown circuit 242, may be set to value to activate the shutdown circuit 242 and thereby reduce power consumption.

For example, the shutdown circuit disconnects or otherwise discontinues deliver of electrical power to respective active circuit components in the AFE circuitry 202 when an idle state such that power is conserved when the AFE circuit 202 is not actively in use. In an example, the shutdown circuit 242 is coupled to discontinue the supply of electrical power high-energy consuming circuitry in the AFE 202 (e.g., transmitter channel circuitry), such as by creating open circuit conditions in the current path between power supplies and power inputs (e.g., bias and/or supply inputs) of such circuitry. As a result, a portable system 100 thus may exhibit improved battery life by controlling the shutdown circuitry to stop delivering electrical power to circuitry of the AFE 202 for one or more spectrometer modules as determined to be an idle state. In a further example, machine learning may be used to infer when the idle state of a respective module exists so as to trigger activation of the shutdown circuit 242 more efficiently.

In some examples, the SoC may be coupled to a computer 250 through a network connection 252. The network connection may include a physical (e.g., electrical and/or optical connection) or a wireless connection. The computer 250 may include instructions executable by one or more processor thereof to implement post-processing code 254. For example, the post-processing code 254 may be configured to implement some or all functions described herein with respect to the processor core 230. The computer 250 may be used in place of or in combination with the processor core 230, such as to implement all or some functions described herein with respect to the processor core 230, such as in distribute computing architecture that includes processor core 230 and computer 250 coupled via the connection 252 and sharing processing functions. In an example, the computer 250 is implemented in a cloud computing architecture.

The SoC 204 may also be coupled to a channel synchronization module 256, such as respective synchronization module 114 of FIG. 1. The synchronization module 256 provides a high-precision clock signal to control timing of functions implemented by the spectrometer 200 for the respective channel. The synchronization may be controlled by the module 200 when operating as a master module or, alternatively, the synchronization may be controlled by another module in which the module 200 operates as a slave module for purposes of synchronization. The synchronization module 256 may be coupled to one or more other modules (configured as the module 200) through a communications link 138, as described herein.

Figure 3:
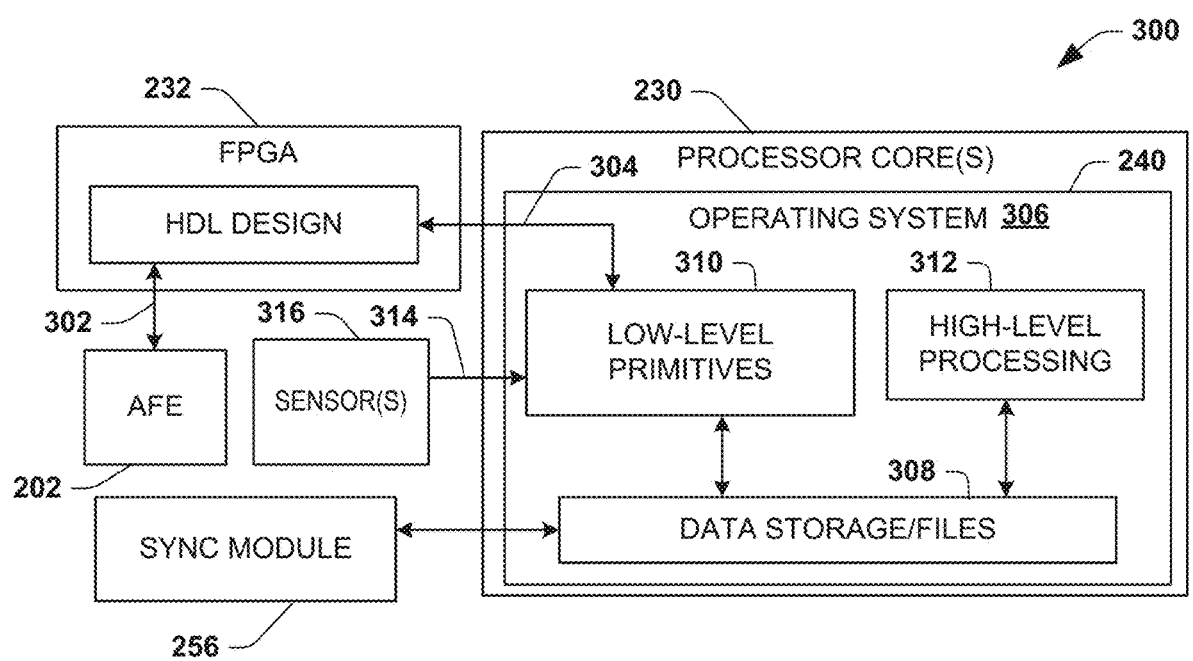
FIG. 3 depicts an example of the overall software flow for the proposed NMR system.

FIG. 3 depicts an example of an overall software flow 300 that may be implemented in a multichannel-channel spectrometer. The software flow may be implemented in the spectrometer 200 of FIG. 2. Accordingly, for ease and consistency of explanation, the description of FIG. 3 also refers to FIG. 2. The software flow 300 includes main segments that may be implemented on the FPGA fabric 232 and the one or more processor cores 230. In an example, the core 230 is an embedded processor core of SoC 204, which may be referred to as a hard processor system (HPS) of a respective SoC, which includes both FPGA 232 and processor core 230.

As an example, the FPGA 232 can interface with the AFE 202 using general-purpose input/output (GPIO) pins 302 or other terminals. The pins 302 provide an interface to enable FPGA 232 to tune the hardware, run the actual pulse sequence(s), and temporarily store the acquired data. The FPGA 232 can be configured using a hardware description language (HDL) design, such as implemented in an industry-standard language (e.g., Verilog or VHDL). An advanced extensible interface (AXI) bus 304 of SoC can be used for bidirectional communication between the FPGA 232 and the processor 230. For example, the AXI bus enables the processor core 230 to write data directly to registers of the FPGA 232. Data inside FIFO or SDRAM of FPGA 232 can also be accessed by the processor core 230 via an on-chip memory-mapped AXI bus. The processor core 230 includes an operating system 306 (e.g., Linux) that enables programming of the processor core without needing to reboot the OS. The OS 306 includes an OS file system 308 that may be used to transfer data between programs written in high-level languages (e.g., C or Python), including programs that run low-level NMR primitives 310 and high-level processing routines 312, respectively.

In addition, the system 300 may include a set of processor input/output (I/O) pins 314 that can be coupled to one or more sensors 316 to input respective sensor data and/or configure respective sensor functions. For example, the sensor 316 may be a temperature sensor configured to measure temperature of the magnet, which may be provided directly into the processor core 230. Additionally, the synchronization module 256 performs synchronization between multiple spectrometers, such as may be realized by implementing a PTP protocol or wired connections in other examples.

As a further example, the data samples acquired by the ADC 226 (FIG. 2) can be transported from the AFE 202 to the FPGA 232 via GPIO pins 302, which data may be stored inside streaming FIFO buffer 236. A direct memory access (DMA) transfer from the FIFO buffer 236 to on-board memory (SDRAM) of the FPGA 232 can be implemented to expand the memory limit. As an example, the 64 MB provided by a small SDRAM is enough to store approximately 1.28 seconds worth of data samples at 25 Msps, which is practically sufficient for most low-field NMR and MRI applications.

In an example, a program running on the processor core 230 is configured to transport acquired data from the FIFO of FPGA 232 to a standard text file (or other) format in the file system 308. This file can be directly transported to a computer or workstation (e.g., computer 250) via a wired or wireless link (e.g., Ethernet or Wi-Fi) if further processing in a more powerful software environment is desired. Alternatively, the availability of Python as well as other high-level processing functions 312 in the OS further enables the possibility of running most (if not all) high-level NMR and/or MRI functions directly on the embedded processor core 230. For example, the high-level processing 312 may include more computationally intensive functions, such as including performing signal processing functions, executing machine learning functions, quadrature downconversion, matched filtering, noise measurement, reflection measurement, frequency and pulse length sweeps, multi-exponential fitting of echo decay curves, inverse Laplace transforms (ILTs) such as for generating T1, T2 and related maps, and Fourier transforms or non-linear reconstruction methods for generating images.

In addition, the ability to analyze data without transferring it to an external PC enables real-time hardware-software co-tuning, which is especially useful in portable spectrometry applications, such as disclosed herein. In one example, a Python program can be configured as the main control module, and run NMR methods 312 by calling executables compiled from various low-level programs 310. In an example, the low-level NMR primitives 310 include program code (executable by processor core 230) configured to implement low-level operations, such as including to program respective registers of the FPGA 232, change the frequency of a PLL, program DACs. The low-level primitives 310 may also be configured to perform hardware tuning, run various NMR pulse programs, analyze the acquired data generated by the pulse programs, make the decision to change experimental parameters if necessary, iterate the process to get desirable results, and finally store the results (in a text file) and/or directly display them to the user (in a graphical format).

Figure 4:
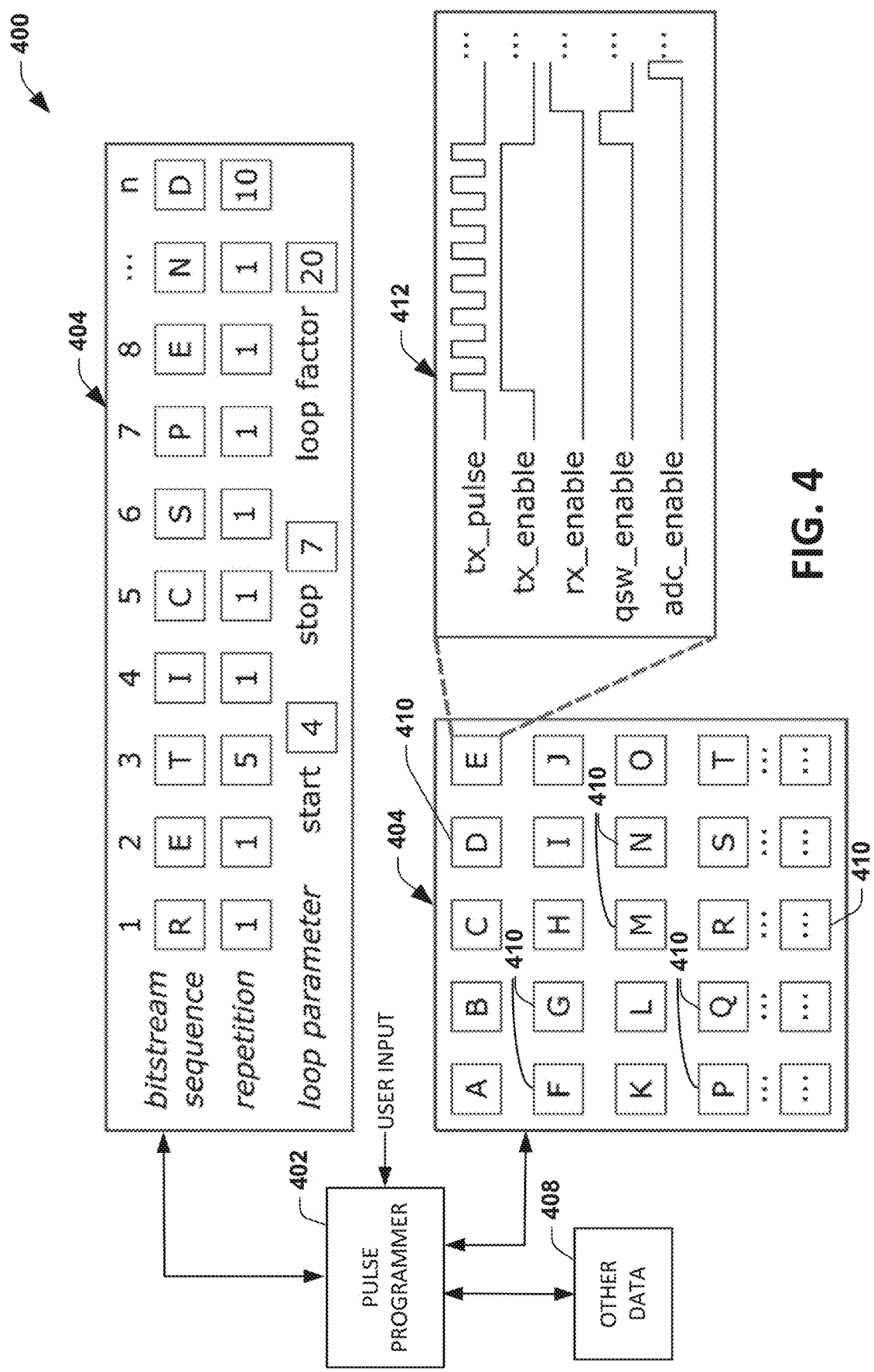
FIG. 4 depicts an example of a pulse programmer module.

FIG. 4 is a block diagram depicting an example of a pulse program control system 400. The pulse program control system 400 includes a pulse programmer 402 that is configured (e.g., program code executable by processor core 230) to generate a pulse program sequence 404 based on bitstream definitions stored in a bitstream bank 406 of embedded memory of the SoC. The pulse program sequence 404 is a useful example of the pulse program that may be implemented by module 234 of the FPGA 232. The pulse programmer sequence, bitstream bank, and bitstream definition 412 for each instance are programmable in the processor core 230 of the SoC, such as using high-level programming (e.g., high-level processing 312 within OS 306), thus minimize the complexity of the FPGA implementation. The pulse programmer 402 further determines the pulse program 404 based on other data and instructions 408, which may specify pulse program parameters (e.g., amplitude, spacing, phase, duration, gradient and the like). For example, the other data and instructions 408 may specify a set of pulse parameters that pulse programmer 402 utilizes as an index to search through the bitstream bank to find a corresponding set of one or more bitstreams to implement as a bitstream sequence for exciting transmit coils to implement the specified parameter set. In an example, the other data may include an output generated by a machine learning program code, which may be implemented in the processor core 230 and/or a remote computer (computer 250). The pulse programmer may also include a user interface to enable a user to construct a bitstream sequence and/or set other parameters associated with the sequence in response to a user input.

As shown in the example of FIG. 4, the bitstream bank 406 includes different a plurality of bitstream instances 410 (shown as including instances A through T and so on). Each bitstream instance 410 includes a bitstream definition that contains sequences of multiple output pulses that are synchronized in time with each other by a single clock reference, such as described herein. For example, each bitstream instance 410 in the bank 406 is programmed to include respective output pulses to control respective AFE hardware (e.g., including transmitter and receiver channels) for generating a transmitter signal with a set of output parameters defined by the instance. In the example of FIG. 4, bitstream instance "E" includes a bitstream definition 412 for defining respective outputs including a transmit pulse, a pulses to enable and disable transmitter and receiver channels 208, 220, to enable respective Q-switches 212, 222 and to enable the ADC 226. Each bitstream instance 410 thus may include a different definition for one or more of the respective outputs for exciting a respective transmitter coil accordingly. The pulse programmer 402 thus can arrange any number of bitstream instances into a bitstream sequence, each of which may be assigned a repetition (e.g., number of times to repeat in the sequence).

As a further example, the pulse program 404 is timing critical in its operation, and is organized in a bitstream sequence that can contain a finite number (n) of bitstream instances 410, along with repetition number attached for each instance. In some examples, a user may also set (in response to a user input) respective loop parameters to create a loop from the start bitstream instance to the stop bitstream instance for a number of times given by the loop factor. The user may further choose the bitstream sequence from bitstream instances 410 defined inside the bitstream bank.

As a further example, the pulse program system 400 supports arbitrary pulse programming, e.g. a Carr-Purcell-Meiboom-Gill (CPMG) sequence that is used in many low-field NMR applications. In this example, the user may specify CPMG parameters, e.g. π/2 pulse length, π pulse length, and echo spacing, in a human-readable format through a user interface (e.g., as input variables with units of μs). The pulse programmer 402 is configured (e.g., by program code using high level processing functions 312) to convert the values from the human-readable format to a corresponding bitstream sequence that is stored in control registers of the pulse program module of the FPGA, such as in form as represented by the pulse program 404. For example, all derived parameters may be sent to the pulse program module in the FPGA via the on-chip AXI bus.

Figure 11:
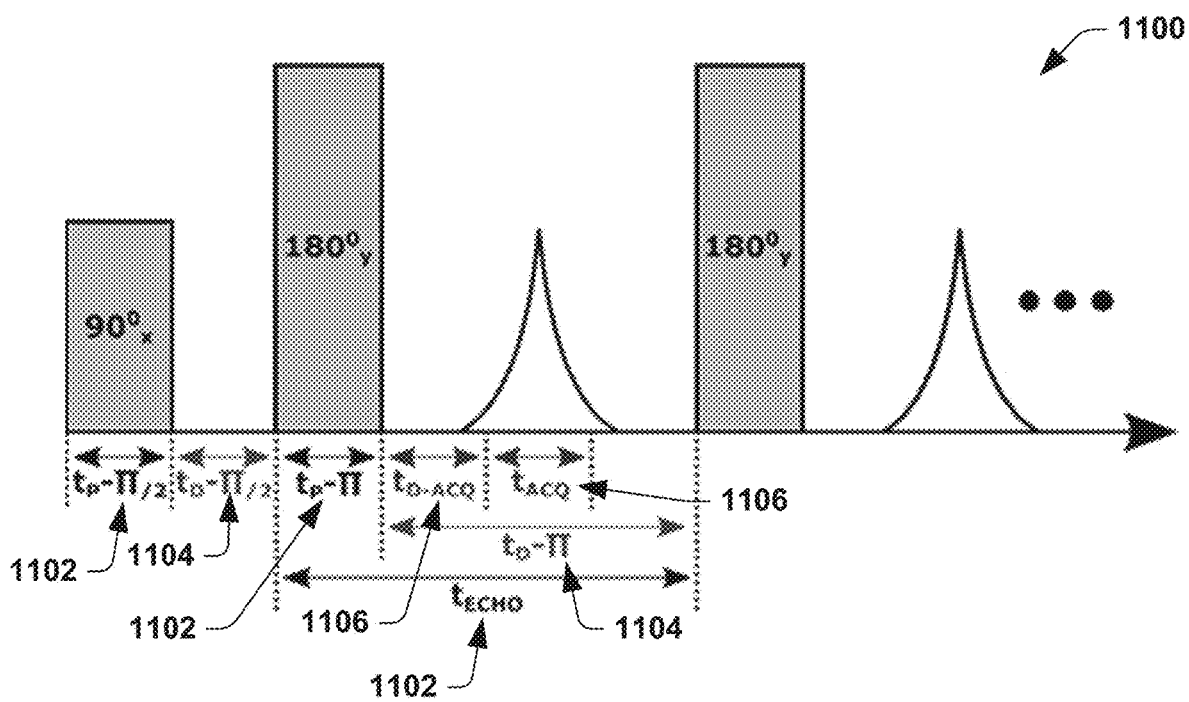
FIG. 11 is a graph depicting an example of a CPMG pulse sequence implemented on the spectrometer.

FIG. 11 depicts an example of x-phase and y-phase pulses 1100 that may be used in the CPMG sequence. For example, FIG. 11 demonstrates a CPMG pulse sequence implemented on the spectrometer 200. In this example, the π/2 pulse is generated once, followed by multiple π pulses. The set of labels 1102 denote user-specified variables within the high-level program, and the labels 1104 denote variables that are computed by the processor core. The labels show 1106 variables that are related to the ADC, which uses a different clock frequency, with $t_{ACQ}$ also being specified by the user in the high-level program.

After this, the overall transmit output signal is enabled or disabled by a control signal also generated by the pulse program 404. In the receiver path, the data from the ADC 226 is captured by the ADC driver and then stored in FIFO 236. As an example, the average echo shape acquired in one scan may be phase-rotated to match those from previous scans, thus enabling averaging. The absolute phases for all experiments should be made identical, i.e., by synchronizing the system clock, NMR transmit clock (i.e., RF frequency), and the ADC clock. In an example, the system clock frequency is chosen to be 16× and 4× of the RF transmit clock and ADC clock, respectively. For a system clock frequency of 16×, the transmit frequency allows (i) more pulse phases (up to 16) to be generated; and (ii) some flexibility during logic design of the pulse program module. Similarly, an ADC clock frequency of 4× the NMR transmit frequency simplifies the implementation of quadrature down-conversion operations within the FPGA 232.

Variations in the absolute phase of the transmitted signal between the refocusing pulse in one scan may also introduce problems. For example, such variations cause additional transverse relaxation, and the effect increases at low Larmor frequencies and high RF power levels. Therefore, it is necessary to synchronize the absolute phase of the transmit signal for every refocusing pulse. Control of the absolute phase can be ensured by only enabling output transmit signals when a counter driven by the system clock reaches multiples of an integer P, where $Pf_0$ is the frequency of the system clock. For a typical example, such as described above, P=16. This condition ensures that all pulse lengths and time delays are integer multiples of the NMR transmit period $1/f_0$ (i.e., the period of the RF waveform). In this case, pulse lengths may shrink or expand by a small amount during frequency sweeps, depending on the closest available match between the lengths specified by the user and the period of the system clock multiplied by P. Fortunately, such changes in pulse lengths are generally small enough to have no significant effect on the acquired signal. Also, other FPGA configurations can be used to avoid this effect if needed, with each design stored as a file on the SoC. For example, one such design can decouple respective transmit and system clocks, which allows pulse lengths and delays to remain strictly constant as the transmit frequency varies.

Figure 5:
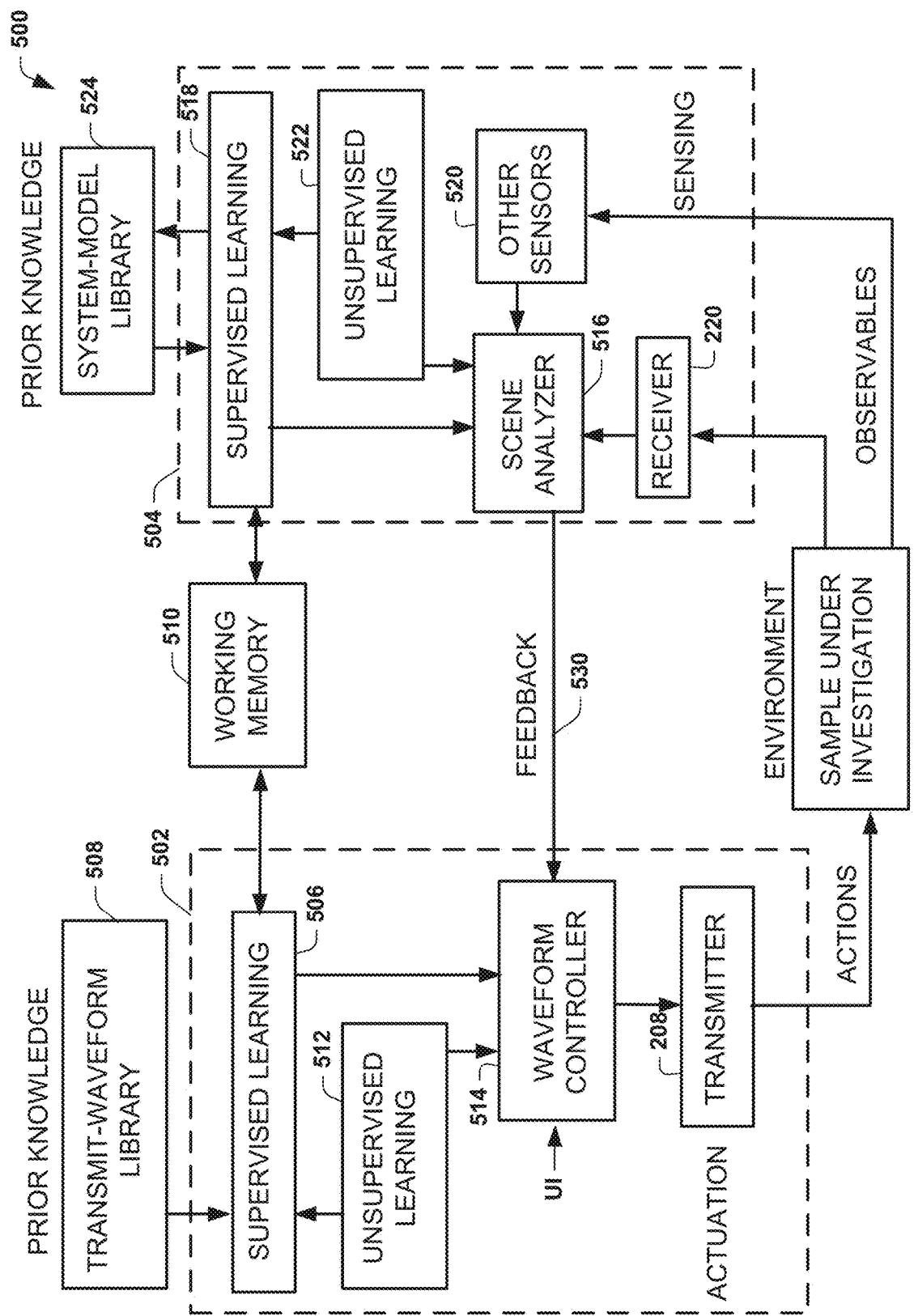
FIG. 5 depicts an example of an autonomous cognitive dynamical systems (CDS) architecture.

FIG. 5 depicts an example of an autonomous cognitive dynamical system (CDS) architecture 500. For example, the CDS architecture 500 may be implemented as instructions executable by the processor core 230 of the SoC, in a remote computer 250 or distributed between the processor core and remote computer. In some examples, the CDS architecture 500 can use one or more memory layers 502 and 504. A two-layer version is shown in the example of FIG. 5; however, different numbers of memory layers may be used in other examples. In the example of FIG. 5, the memory layer 502 is configured to determine parameters to control actuation of one or more transmitter channels (e.g., channels 208) for exciting respective transmitter coil 214 of an MR system 100, 200. The other memory layer 504 is configured to analyze signals received by one or more receiver channels (e.g., channels 220) from receiver transmitter coil 228 of the MR system 100, 200 responsive to the excitation of the transmitter coil 214 of the respective channel. In an example, the CDS architecture 500 can be implemented by the processor core to enable autonomous operation of the MR system 100.

The actuation layer 502 includes a supervised learning module 506 and an unsupervised learning module 512 (e.g., high-level processing code 312 in processor core 230). The supervised learning module 506 is configured to implement supervised learning based on training data to determine parameters of an actuation function for controlling operation of a transmitter channel 208. The supervised learning module 506 is coupled to utilize data stored in a transmit-waveform library 508, working memory 510 as well as direct feedback from the sensing layer 504. The transmit-waveform library 508 stores training data corresponding to transmit-waveforms over several state spaces. The working memory 510 may be shared between the respective memory layers 502, 504 to provide respective input and output data to respective supervised learning modules. The learning module 512 may be programmed to implement unsupervised learning (e.g., via reinforcement learning algorithms) on the state space parameters to infer parameters according to a defined outcome or goal (e.g., user defined in response to a user input) for controlling the transmitter channels 208. The unsupervised learning module 512 may be implemented in situations when the training data is insufficient to enable classification of a solution for the actuation state space (e.g., an unexpected case). Additionally or alternatively, the learning module 512 may implemented to adjust weights and refine the model implemented by the supervised learning module 506.

For example, the supervised learning module 506 is programmed to implement a machine learning algorithm, such as linear regression, logistical regression, polynomial regression, with respect to one or more trained models for determining transmitter parameters according to a desired metric. The other learning module 512 may implement an agent in a reinforcement learning framework to optimize a set transmitter parameters to achieve a desired state (or metric). One or both learning modules thus may classify a set of parameters that map to respective transmitter parameters from which a waveform controller 514 can to generate one or more pulse programs. For example, the supervised learning algorithm provides an index, and the waveform controller 514 employs the index within a look-up table or other data structure to construct a bitstream sequence. Alternatively, the learning module 506, 512 may provide a pulse parameters from which the waveform controller 514 determines the bitstream sequence.

The memory layer 504 also includes a supervised learning module 518 and an unsupervised learning module 522 (e.g., both implemented as code executable by the processor core). The supervised learning module 518 is coupled to utilize data stored in a system-model library 524, working memory 510 and further may use the learning function 522 which is programmed during a learning process associated with the sensing functionality of the MR system. The supervised learning module 518 is configured to implement supervised learning of system operation to classify or categorize image features and related characteristics of the sample under investigation according to one or more metrics, which may be user-defined in response to a user input. Examples of image features or classifications that one both learning modules 518, 522 may include 1) image segmentation, and 2) classifying each image segment into categories based on the type of tissue or other characteristics of the sample/object under investigation.

For example, a scene analyzer 516 is coupled to receive acquired image data from the receiver channel 220 as well as other sensor data from one or more other sensors 520. The other sensors 520 may include a magnet temperature sensor, accelerometers coupled to describe motion of the coils or sample, and/or biosignals (e.g., electrocardiograms, respiration, test object/body temperature, pulse and the like). The scene analyzer 516 also receives classified or categorized features from one or both learning modules 518 and 522. The scene analyzer 516 is configured to extract a feature set of system parameters based on the receiver data, other sensor data and classification data.

As mentioned, the scene analyzer 516 also provides multi-parameter feedback to the waveform controller 514. For example, a scene analyzer 516 may extract an image from a background, segment the extracted image signal and identify contours around objects in the image. The learning modules 518, 522 implemented in layer 504 may determine and/or assign categories or classes to segmented regions, which may be applied as labels to each segment. The scene analyzer (e.g., a Kalman or auxiliary particle filter) 516 is configured to provide feedback information 530 to the waveform controller 514, such as describing an actionable condition or characteristic of the MR system or the environment (i.e., sample/object or other sensed parameters). The waveform controller 514 may implement one or more actions directly responsive to the feedback 530. The feedback information 530 may also be analyzed by learning module 506, 512 to determine a set of actions (e.g., parameters for transmitted RF and gradient waveforms) for fulfilling user-defined goals (e.g., implement planning and optimal control).

For example, the feedback 530 may be based on sensor data 520, such as to indicate when the transmit signal is overheating the sample or object under test. The waveform controller thus may be configured to implement action to adjust (e.g., immediately) on or more waveform parameters in response to the feedback. Additionally, or alternatively, the waveform controller may be instructed, based on a type or category of one or more regions of the sample under test (as determined by scene analyzer), to perform a number of repetitions of one more bitstream instances in a next scan to enable further analysis by the scene analyzer and sensing learning modules 518, 522. The system 500 may also include a user interface (not shown) through which a user can specify which one or more features are to be optimized (e.g., type of tissue, resolution, etc.).

As a further example, the CDS architecture 500 utilizes the following: i) multi-level feedback between the sensing and actuating functions (i.e., receivers and transmitters), including both global perception-action cycles that act through the environment and local shunt cycles that act within the CDS; and ii) top-down attention and planning mechanisms enabled by embedded short-term and long-term memory.

As described herein, the ability to run an embedded OS enables SoC-based spectrometers to directly support high-level programming languages. For example, the widespread use of the Python language and libraries for scientific computation makes it a natural choice for creating high-level application programming interfaces (APIs) for NMR and MRI systems, such as disclosed herein. For example, Python runs on the ARM-based architectures available on SoCs, thus enabling autonomous spectroscopy and imaging. More broadly, the availability of a fully-featured Python-based API for MRI will enable software developers to easily write a variety of novel applications, which is analogous to similar developments in machine learning and edge/fog computing. Furthermore, the software-configurability and on-board processing capabilities of SoC-based NMR spectrometers and MRI consoles enables such devices to operate semi- or fully-autonomously, i.e., with little or no human intervention.

A key challenge in implementing such CDS architecture 500 is effective parameterization of NMR and MRI pulse programs, i.e., defining the library of transmitted waveforms 508. MRI uses a wide variety of complex pulse sequences, resulting in high-dimensional action spaces. To resolve this issue, a hierarchy of adaptation levels (e.g., to direct the level and type of feedback and/or control the time scale for making adjustments) may be defined for use in the CDS architecture. Further examples of configurable parameters in the system 500, namely: i) values of low-level parameters (frequency, phase, and power level of RF pulses, inter-pulse delays, gradient pulse durations, etc.) within pre-defined pulse sequences; ii) choice of higher-level sequence motifs (e.g., slice selection, spatial encoding, phase cycling, etc.);

and iii) selection of the overall pulse sequence (spin-density imaging, diffusion-weighted imaging, etc.). This type of representation is useful because it enables increased abstraction at higher levels of the hierarchy.

Figure 6:
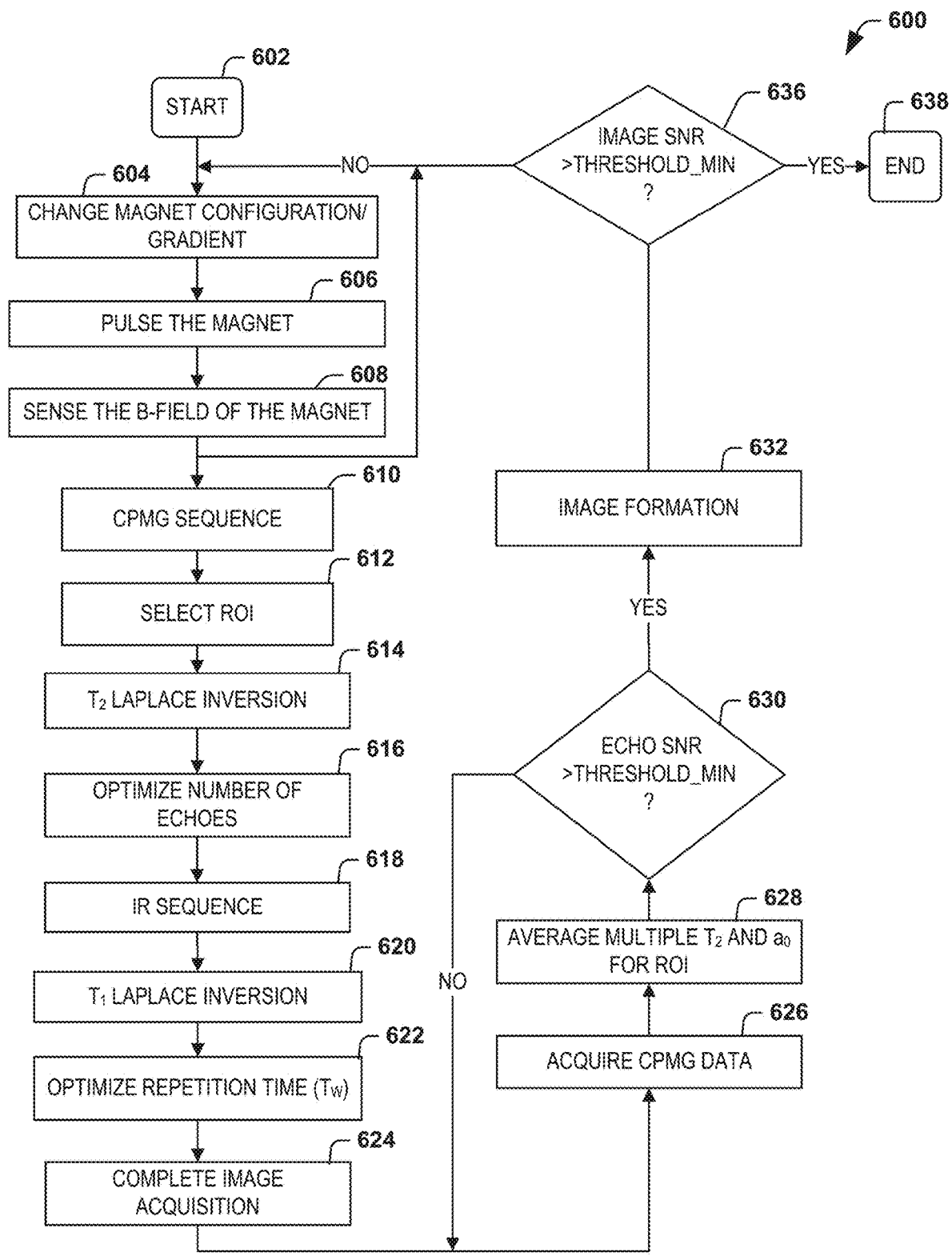
FIG. 6 is a flow diagram depicting an example method for automatically adjusting spectrometer parameters.

FIG. 6 is a flow diagram depicting an example of a method 600 for implementing autonomous image acquisition. In this example, the processor core 230 of the SoC is programmed (e.g., high-level processing function 312 to automatically adjust magnet configuration and optimize its operating parameters for a CPMG sequence (e.g., number of echoes $N_E$ and wait time $T_W$ for CPMG-like sequences) to maximize a user-defined performance metric (e.g., SNR per unit time, resolution or the like) as the sample properties and/or system operating parameters change.

The method begins at 602, such as at power up with operating parameters being set to initial values. At 604, the magnet configuration is changed. For example, the configuration may be changed by using different current for the gradient coil to change its gradient field, or by pulsing the magnet at 606 (e.g., by magnet controller supplying current to a magnet to change its magnetic field). At 608 the magnetic (B) field is sensed by the magnetic field sensor to evaluate the magnet/gradient configuration. The method 600 may loop at 604-608 to provide a desired magnet configuration.

At 610 a CPMG sequence is applied for exciting the transmitter coil. At 612, a region of interest (ROI) in the image data is selected. At 614, Laplace inversion is implemented with respect to the selected ROI. For example, because the samples may not have mono-exponential decays, the method 600 performs 1-D Laplace inversions to account for all $T_1$ and $T_2$ relaxation components. In each case, the regularization parameter can be set using known methods, e.g., the heel or Butler-Reeds-Dawson (BRD) methods. In an example, the method may start by using a CPMG experiment with a fixed $T_E$ to optimize the number of echoes needed to obtain the maximum SNR. In this first scan, for example, the method may collect enough echoes to ensure that all $T_2$ components decay by at least two time constants, thus ensuring an accurate Laplace inversion. The $T_2$ distribution may also be determined. At 616, the longest significant $T_2$ component can then be extracted from the inversion and used to optimize the number of echoes $N_E$.

At 618, an inversion recover (IR) sequence is performed. For example, the IR sequence may be used to generate a heavily $T_1$-weighted image for the object (sample) under test. By selecting the longest component, it may be ensured that all data is collected in future scans. However, the optimum value of $\beta = N_E T_E/T_2$ depends on $\alpha = T_W/T_1$ (see, e.g., FIGS. 7 and 8), which is unknown since no $T_1$ information has been acquired yet. Thus, the value of $N_E$ is temporarily selected to result in $\beta = 1$. This is a reasonable estimate based on the plot, and will be improved once $T_1$ Laplacian inversion is performed at 620. Then, at 622, the $T_1$ distribution is found and the repetition time $T_W$ is optimized.

At 624, image acquisition is completed. At 626, CPMG data is acquired for further processing in the method. At 628, multiple $T_2$ and $a_0$ are averaged based on the acquired image data. The SNR of the spin echoes is acquired and a determination is made at 630 whether a minimum echo SNR is reached (e.g., does the echo SNR exceed a minimum threshold). For example, the minimum SNR defines how good the image is, and can be configurable, including during use. A higher SNR may increase the wait time. If the determination at 630 is negative, the method may return to 624 for additional acquisition of CPMG data. The additional data acquisition at 626 may be implemented with a different magnet configuration in order to improve SNR via averaging with different set of image data. If the determination at 630 is affirmative, the method may proceed to 632.

At 632, image formation is performed. For example, the adaptive sampling is used to autonomously acquire an image with a certain quality, which may require a different time length for the whole image acquisition depending on the sample or object being imaged. At 636, the method determines whether a minimum image SNR is reached based on the image formed at 632. After the minimum image SNR is reached, the method may end at 640. However, if minimum image SNR is not reached, the method may return to 604 and repeat the method until the end condition at 636 is met.

Figure 7:
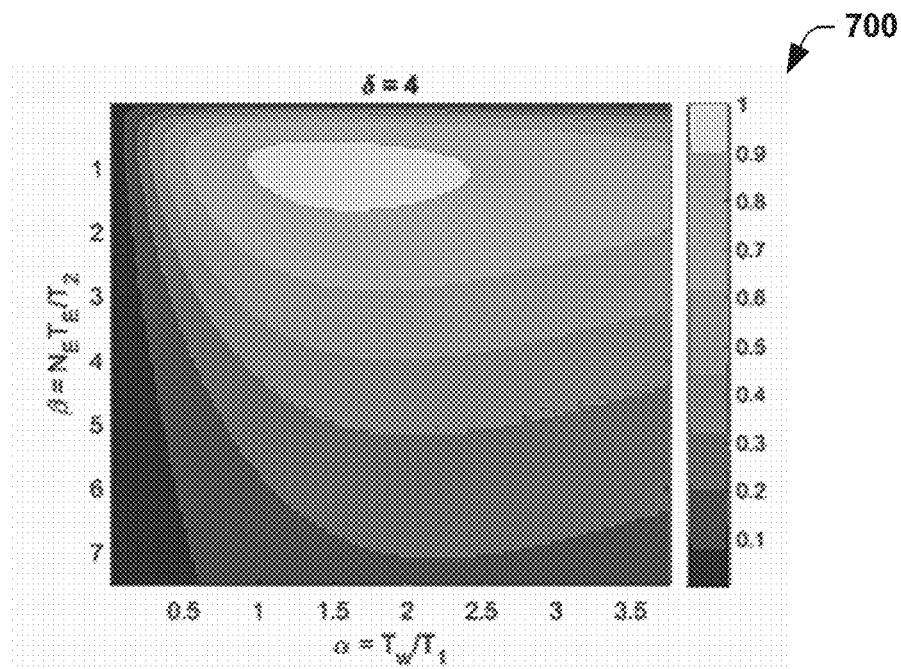
FIG. 7 is a plot showing expected dependence of SNR per unit time for $\alpha$ and $\beta$.
Figure 8:
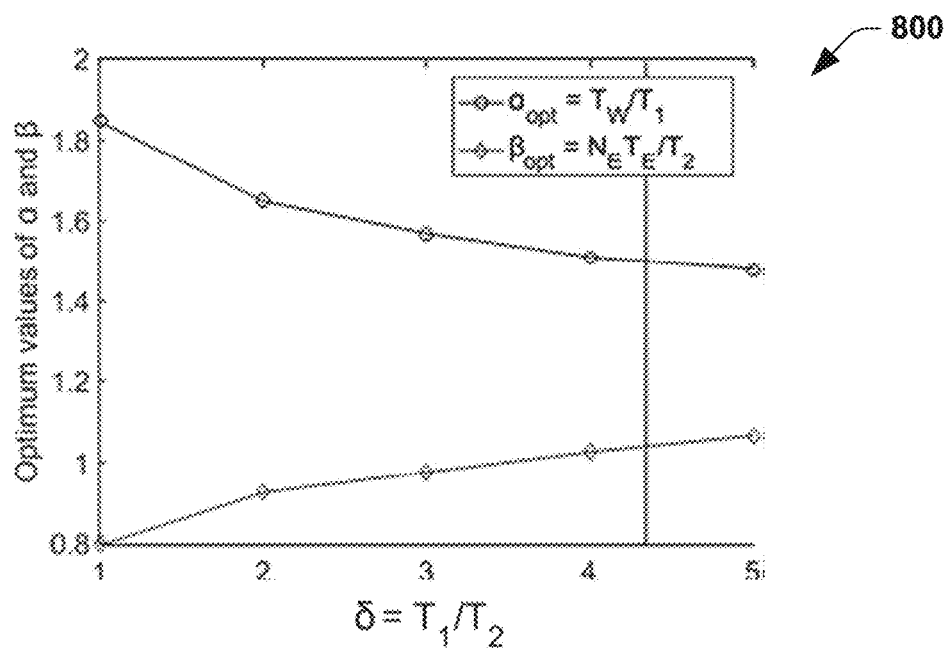
FIG. 8 is a graph showing expected dependence of optimal values of $\alpha$ and $\beta$ as a function of $\delta$.

As a further example, FIGS. 7 and 8 demonstrate relationships for $\alpha$ and $\beta$ associated with an inversion recovery sequence. Specifically, FIG. 7 is a plot showing expected dependence of SNR per unit time and FIG. 8 is a graph showing expected dependence of optimal values of $\alpha$ and $\beta$ as a function of $\delta$. As described herein, inversion recovery (IR) sequences (e.g., implemented on spectrometer systems described herein) can be automated using the optimal value of $N_E$ such as estimated above in FIG. 6. For example, the longest wait time is set to a value of $10 \times T_2$, which is more than sufficient to make sure that all $T_1$ relaxation components can be detected. The resulting IR data is inverted to extract all $T_1$ components. The longest significant component is then extracted from the data and used for $T_W$ optimization. Now, since $\delta = T_1/T_2$ is known, the optimum values of $\alpha$ and $\beta$ can be read from FIG. 8. Thus, the sample can be localized within the feasible region of the $(T_1, T_2)$ plane, which is denoted by the shaded region 902 in FIG. 9. The optimal values of both $N_E$ and $T_W$ can now be determined. Note that this optimization process may be avoided through the use of 2-D Laplace inversions (at 614 and 620 of FIG. 6), which are computationally intensive on low-power embedded ARM processors.

Figure 9:
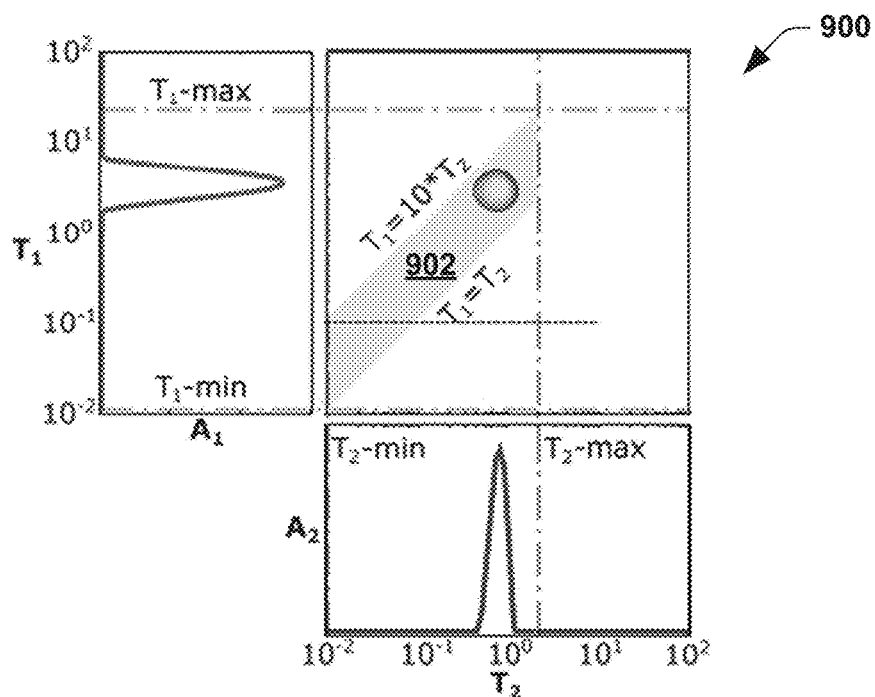
FIG. 9 depicts an example of the measured time components and distributions of a test sample.

FIG. 9 depicts an example of the measured time components and distributions of a test sample. FIG. 9 depicts the results of an automated IR sequence, including measured $T_1$, $T_2$, and joint $(T_1, T_2)$ distributions of a test sample (e.g., milk). FIG. 9 shows magnitude contours of the $(T_1, T_2)$ distribution, while $T_1$ and $T_2$ axes are in sec. The feasible region of $(T_1, T_2)$ for an unknown sample, assuming $1 \leq \delta \leq 10$, is denoted by the shaded region 902. The boundaries of this region (i.e., $T_{1,min}$, $T_{1,max}$, $T_{2,min}$, and $T_{2,max}$) may be determined by prior knowledge.

As a further example of autonomous operation according to the method 600 of FIG. 6, the MR system is configured to first optimize the pulse parameters and then run CPMG sequences to periodically monitor the contents of the sample coil. It may be assumed that relevant changes in sample properties can be detected directly from the echo decays, such that inverting the data during the monitoring period may be omitted to reduce total processing time. Instead, the sums of the first and second halves of the echo train may be computed, which are denoted by $a_1$ and $a_2$ respectively. This process allows SNR to be improved through data accumulation while retaining both amplitude and $T_2$ information. The monitoring process starts by collecting a few (e.g., 10) separate $a_1$ and $a_2$ data points and computing their mean and standard deviation. The $a_1$ and $a_2$ values measured for the next CPMG data set are then compared to their statistics from the previous few scans. The condition for determining if the sample has not changed may then be represented as follows:

$$|a_1 - \overline{a_1}| \leq 3\sigma_{a_1} \text{ and } |a_2 - \overline{a_2}| \leq 3\sigma_{a_2} \qquad \text{Eq. 1}$$

where $\sigma_{a_1}$ and $\sigma_{a_2}$ are the standard deviations of the $\alpha$ values respectively, $\overline{a_1}$ and $\overline{a_2}$ are their means, and $a'_1$ and $a'_2$ are the newly collected data points. If the above equation is satisfied, the system replaces the oldest $a_1$ and $a_2$ data points with $a'_1$ and $a'_2$ and continues to monitor the current sample. Similarly, the condition for determining if the sample has changed becomes:

$$|\overline{a_1}-\overline{a'_1}| \geq 3\sigma_{a_1} \text{ and } |\overline{a_2}-\overline{a'_2}| > 3\sigma_{a_2} \quad \text{Eq. 2.}$$

If this preceding condition is satisfied, the system re-optimizes parameters for the newly detected sample using the procedure shown in FIG. 6, and then continues the monitoring process.

Figure 10:
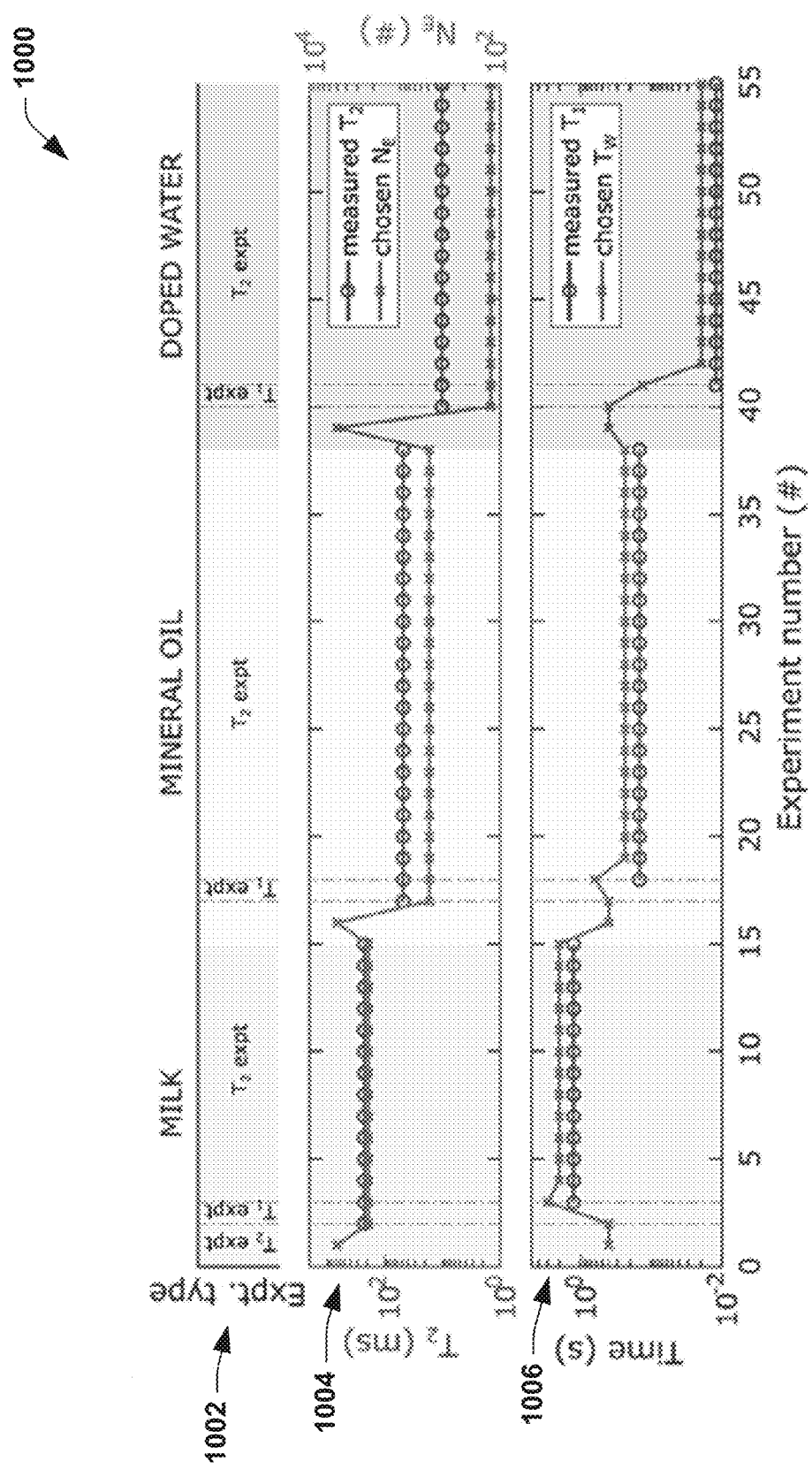
FIG. 10 is a plot depicting example results from automatic parameter optimization on multiple different samples.

FIG. 10 are a plots 1002, 1004 and 1006 depicting example results from autonomous NMR parameter optimization method (e.g., method 600) which may be performed for multiple different sequence types and for samples. In this example, the three samples were milk, mineral oil, and doped water, as shown in respective vertical columns of the plots 1002, 1004 and 1006 sample used at any given time. Changes in experiment type are denoted by vertical dashed lines. Plot 1002 demonstrates the type of experiment selected by the instrument. Plot 1004 illustrates the measured slowest $T^2$ component obtained using $T_2$ Laplace inversion along with the corresponding number of echoes ($N_E$) used in the experiment. It can be seen that $N_E$ varies between samples according to the measured $T_2$. The increase in $N_E$ at the beginning and when the sample is changed corresponds to loading typical parameters in the program flowchart, which eventually converge to a value proportional to the sample $T_2$. Plot 1006 illustrates the measured slowest $T_1$ component obtained using $T_1$ Laplace inversion along with corresponding repetition time ($T_W$) used in the experiment. After every sample change, $T_W$ starts with typical values and eventually converges to a value proportional to the sample $T_1$.

FIG. 10 shows that the system can quickly detect when the sample changes, and then run the routine shown in FIG. 6 to automatically obtain optimized NMR pulse parameters. Experimentally, the slowest $T_2$ components found for milk, mineral oil, and doped water were approximately 225 ms, 48 ms, and 10 ms respectively; the optimum values of $N_E$ were 2259, 480, and 102 respectively; the slowest $T_1$ components were 1.26 s, 146 ms, and 12 ms, respectively; and the optimum values of $T_W$ were 2 s, 235 ms, and 19 ms respectively. These NMR results, which are for bulk measurements of the entire sample, can be extended to image-based MRI experiments in a straightforward way according to the examples disclosed herein. For example, each of the steps described previously can be performed based on a selected region of interest (ROI) in the image. Additionally, the spectrometer module disclosed herein may be configured to autonomously optimize MR measurement data and the image acquisition process based on user-specified targets and constraints.

In further view of the foregoing structural and functional description, those skilled in the art will appreciate that portions of the invention may be embodied as a method, data processing system, or computer program product. Accordingly, these portions of the present invention may take the form of an entirely hardware embodiment, an entirely software embodiment, or an embodiment combining software and hardware. Furthermore, portions of the invention may be a computer program product on a computer-usable storage medium having computer readable program code on the medium. Any suitable computer-readable medium may be utilized including, but not limited to, static and dynamic storage devices, hard disks, optical storage devices, and magnetic storage devices.

Certain embodiments of the invention have also been described herein with reference to block illustrations of methods, systems, and computer program products. It will be understood that blocks of the illustrations, and combinations of blocks in the illustrations, can be implemented by computer-executable instructions. These computer-executable instructions may be provided to one or more processor of a general purpose computer, special purpose computer, or other programmable data processing apparatus (or a combination of devices and circuits) to produce a machine, such that the instructions, which execute via the processor, implement the functions specified in the block or blocks.

These computer-executable instructions may also be stored in computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

What have been described above are examples. It is, of course, not possible to describe every conceivable combination of structures, components, or methods, but one of ordinary skill in the art will recognize that many further combinations and permutations are possible. Accordingly, the invention is intended to embrace all such alterations, modifications, and variations that fall within the scope of this application, including the appended claims.

As used herein, the term "includes" means includes but not limited to, and the term "including" means including but not limited to. The term "based on" means based at least in part on.

What is claimed is:

1. A multi-channel magnetic resonance (MR) system comprising:
   a plurality of radio frequency (RF) coils;
   a plurality of spectrometer transceiver channels, each of the channels comprising:
   a spectrometer coupled a respective set of the RF coils, the spectrometer configured to transmit RF signals to excite respective RF coils and to receive MR sensor signals from the excited respective RF coils responsive to excitation thereof, the spectrometer configured to perform MR spectrometry to provide MR measurement data based on the received MR sensor signals for the respective channel; and
   a synchronization module coupled to the spectrometer of the respective channel, the synchronization module configured to synchronize the spectrometer of the respective channel with spectrometers in other channels via a communication link.

2. The system of claim 1, wherein each spectrometer is implemented as a multi-channel spectrometer module comprising:

a system on chip (SoC), the SoC comprising a field programmable gate array (FPGA) and a processor core, the processor core coupled to the FPGA through a bus on the SoC; and analog front-end (AFE) circuitry coupled to the FPGA, the AFE circuitry including respective transmitter and receiver channels configured to transmit and receive respective RF signals.

3. The system of claim 2, wherein the FPGA of each spectrometer module comprises:

a pulse program module coupled to an input of transmitter channels of the respective AFE circuitry, the pulse program module configured to provide a bitstream sequence to control one or more respective transmitter channels to excite one or more respective RF transmitter coils; and a buffer coupled to an output of receiver channels of the respective AFE circuitry, the buffer configured to receive and store a digital representation of the received MR sensor signals produced by one or more respective RF receiver coils based on the excited one or more respective RF transmitter coils.

4. The system of claim 3, wherein the processor core of each spectrometer module is programmed to generate the bitstream sequence for each of the transmitter channels of the respective of the respective AFE circuitry.

5. The system of claim 4, wherein the processor core includes pulse programmer code programmed to generate the bitstream sequence in response to a user input and/or based on an output produced by machine learning program code.

6. The system of claim 3, wherein the bitstream sequence comprises a plurality of bitstream instances arranged in a selected order, each of the bitstream instances defining parameters of a set of output signals for controlling the AFE circuitry.

7. The system of claim 2, wherein the FPGA of each spectrometer module comprises a hardware tuner coupled to control one or more operating parameters of the AFE circuitry.

8. The system of claim 7, wherein the AFE circuitry of each spectrometer module includes a shutdown function configured to control delivery of electrical power to circuitry in the respective transmitter and receiver channels, the hardware tuner configured to activate the shutdown function to discontinue delivery of the electrical power to the circuitry in the respective transmitter and receiver channels in response to detecting an idle state for the respective spectrometer module.

9. The system of claim 7, wherein the hardware tuner is coupled to a tunable impedance network of respective RF coils for a respective spectrometer module, the hardware tuner configured to set the impedance of the tunable impedance network for the respective RF coils.

10. The system of claim 1, wherein each synchronization module is configured to implement a precision time protocol (PTP) through the communication link.

11. The system of claim 1, wherein each of the channels further comprises a multiplexer coupled between a respective channel spectrometer and respective RF coils, the multiplexer configured to perform time-division multiplexing of the RF signals being transmitted from a given transmitter to each of the RF coils for the respective channel.

12. The system of claim 2, further comprising a remote computer, the SoC in communication with the remote computer through a network communication link.

13. A multi-channel magnetic resonance (MR) spectrometer module, comprising:

a system on chip (SoC), the SoC comprising a field programmable gate array (FPGA) and a processor core, the processor core coupled to the FPGA through a bus on the SoC, the SoC having a synchronization input to receive a synchronization signal, the SoC controlling timing an operation of the spectrometer module based on the synchronization signal; and analog front-end (AFE) circuitry coupled to the FPGA, the AFE circuitry including transmitter channels and receiver channels, each transmitter channel configured to transmit and respective radio frequency (RF) signals to respective outputs adapted to be coupled to respective transmitter RF coils, each receiver channel configured to receive respective MR sensor signals at respective inputs adapted to be coupled to respective receiver RF coils, wherein the SoC is configured to control the AFE circuitry and to process data representing the received MR sensor signals.

14. The spectrometer module of claim 13, wherein the FPGA comprises:

a pulse program module coupled to an input of the transmitter channels, the pulse program module configured to provide a bitstream sequence to control one or more respective transmitter channels to excite one or more respective RF transmitter coils; and a buffer coupled to an output of the receiver channels, the buffer configured to receive and store a digital representation of the received MR sensor signals produced by one or more respective RF receiver coils based on the excited one or more respective RF transmitter coils.

15. The spectrometer module of claim 14, wherein the processor core is programmed to generate the bitstream sequence for the respective transmitter channels.

16. The spectrometer module of claim 15, wherein the processor core includes pulse programmer code programmed to generate the bitstream sequence in response to a user input and/or based on an output produced by machine learning program code.

17. The spectrometer module of claim 15, wherein the bitstream sequence comprises a plurality of bitstream instances arranged in a selected order, each bitstream instance defining parameters of a set of output signals for controlling the AFE circuitry.

18. The spectrometer module of claim 14, wherein the FPGA comprises a hardware tuner, wherein the AFE circuitry includes a shutdown circuit configured to control delivery of electrical power to circuitry in the respective transmitter and receiver channels, the hardware tuner configured to activate the shutdown function to discontinue delivery of the electrical power to the circuitry in the respective transmitter and receiver channels in response to detecting an idle state for the spectrometer module.

19. The system of claim 13, wherein the processor core includes machine learning program code configured to at least one of autonomously determine operating parameters for the spectrometer module or determine a magnet configuration for the respective transmitter and receiver RF coils.

20. A system comprising:

a plurality of instances of the spectrometer module of claim 13;

a multi-element coil system that includes respective transmitter RF coils and receiver RF coils for each instance of the spectrometer module; and synchronization modules coupled to respective instances of the spectrometer module, the synchronization module configured to synchronize the respective spectrometers via a communication link.

* * * * *